US006975814B2

(12) United States Patent
Tsusaka et al.

(10) Patent No.: US 6,975,814 B2
(45) Date of Patent: Dec. 13, 2005

(54) IMAGE FORMING APPARATUS

(75) Inventors: Shusaku Tsusaka, Nagoya (JP); Sakae Ito, Nishikasugai-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 258 days.

(21) Appl. No.: 10/658,809

(22) Filed: Sep. 10, 2003

(65) Prior Publication Data

US 2004/0051769 A1 Mar. 18, 2004

(30) Foreign Application Priority Data

Sep. 12, 2002 (JP) ............................ 2002-267165

(51) Int. Cl.[7] ......................... G03G 15/00; B41J 21/13
(52) U.S. Cl. ........................... 399/6; 347/108; 399/107
(58) Field of Search ............................... 399/6, 37, 88, 399/107, 108, 109, 110, 124; 347/108, 138, 347/152

(56) References Cited

U.S. PATENT DOCUMENTS

| | | | | |
|---|---|---|---|---|
| 5,887,226 | A | 3/1999 | Taki | |
| 6,907,206 | B2 | 6/2005 | Hattori et al. | |
| 2004/0096229 | A1 * | 5/2004 | Yoshihara et al. | 399/33 |
| 2004/0131378 | A1 | 7/2004 | Hattori et al. | |
| 2004/0190963 | A1 * | 9/2004 | Ito | 399/395 |

FOREIGN PATENT DOCUMENTS

| | | |
|---|---|---|
| EP | 0 240 337 A2 | 10/1987 |
| EP | 1 089 142 A2 | 4/2001 |
| JP | 08-006336 | 1/1996 |
| JP | 08-101547 | 4/1996 |
| JP | A 8-139834 | 5/1996 |
| JP | A 10-143053 | 5/1998 |
| JP | A 11-341203 | 12/1999 |
| JP | 2000-098859 | 4/2000 |
| JP | 2001-156964 | 6/2001 |
| JP | 2002-185154 | 6/2002 |

* cited by examiner

*Primary Examiner*—Hoan Tran
(74) *Attorney, Agent, or Firm*—Oliff & Berridge PLC

(57) ABSTRACT

An image forming apparatus includes an image forming unit having an image forming portion positioned over a partition wall that vertically partitions a body frame above a cover plate. A second circuit board in which a tall electronic component-mounting side is upward directed is placed in a space between the partition wall and the cover plate. A first circuit board in which an electronic component-mounting side is downward directed is placed on a lateral side of the second circuit board. The first and second circuit boards are placed in a stepwise manner so that the level of the first circuit board is higher than that of the second circuit board. A return path for reversely transporting a sheet is formed between the cover plate and the upper face of a return tray.

36 Claims, 8 Drawing Sheets

IMAGE FORMING APPARATUS

BACKGROUND OF THE INVENTION

1. Field of the Invention

The present invention relates to an attaching structure of a control board in an electronic appliance, and more particularly to an image forming apparatus such as a laser printer, a copier, or a facsimile apparatus into which the control board is attached.

2. Description of the Related Art

JP-A-8-139834 (see pages 2 to 6 and FIGS. 2 and 10) discloses an image forming apparatus in which an image forming unit is disposed in an upper side of a body case thereof, and a plurality of control boards (circuit boards) on which electronic components constituting a control section are mounted are placed in a lower side of the body case.

In installing the plurality of control boards in the body case of the image forming apparatus, it is necessary to consider not only the thickness of the control boards, but also other conditions such as the sizes of the electronic components to be mounted on the control boards, placement of harnesses for connecting the electronic components on the control boards with other electronic components, and easiness of attachment of the control boards and the harnesses.

When a sufficient space is secured in the body case in consideration of these conditions, however, the size of the whole image forming apparatus increases needlessly, thereby causing a problem in that the requirement of miniaturization is hardly met.

SUMMARY OF THE INVENTION

The present invention has been made to solve the above problems, and therefore one object of the present invention is to provide an image forming apparatus in which a plurality of circuit boards are placed while preventing the size of the apparatus from being increased.

According to one aspect of the invention, there is provided an image forming apparatus including: a body case; an image forming unit disposed in the body case for forming an image on a recording medium; a transporting section disposed in the body case for transporting the recording medium; a first circuit board which is disposed in the body case and on which electronic components are mounted; and a second circuit board which is disposed in the body case in substantially parallel to the first circuit board and on which electronic components that are horizontally deviated from and larger in size than the electronic components mounted on the first circuit board are mounted, wherein at least a part of the transporting section is placed in a space which is defined by a height difference between the electronic components mounted on the first circuit board and the electronic components mounted on the second circuit board.

According to another aspect of the invention, there is provided an image forming apparatus including: a body case; an image forming unit disposed in the body case for forming an image on a recording medium; a transporting section disposed in the body case for transporting the recording medium; a first circuit board which is disposed in the body case and on which electronic components are mounted; and a second circuit board which is disposed in the body case in substantially parallel to the first circuit board and on which electronic components that are larger in size than the electronic components mounted on the first circuit board are mounted, wherein the transporting section is placed in a position which is opposed to the first circuit board, and which is not opposed to the second circuit board.

According to still another aspect of the invention, there is provided an image forming apparatus including: a body case; an image forming unit disposed in the body case for forming an image on a recording medium through an electrophotographic process; a fixing unit disposed in the body case for fixing the image that is formed on the recording medium by the image forming unit; a transporting section disposed in the body case for transporting the recording medium; a first circuit board which is disposed in the body case and on which electronic components are mounted; and a second circuit board which is disposed in the body case and on which electronic components that are larger in size than the electronic components mounted on the first circuit board are mounted, wherein the electronic components mounted on the second circuit board are placed in a space which is defined between the image forming unit and the fixing unit.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Figure 1:
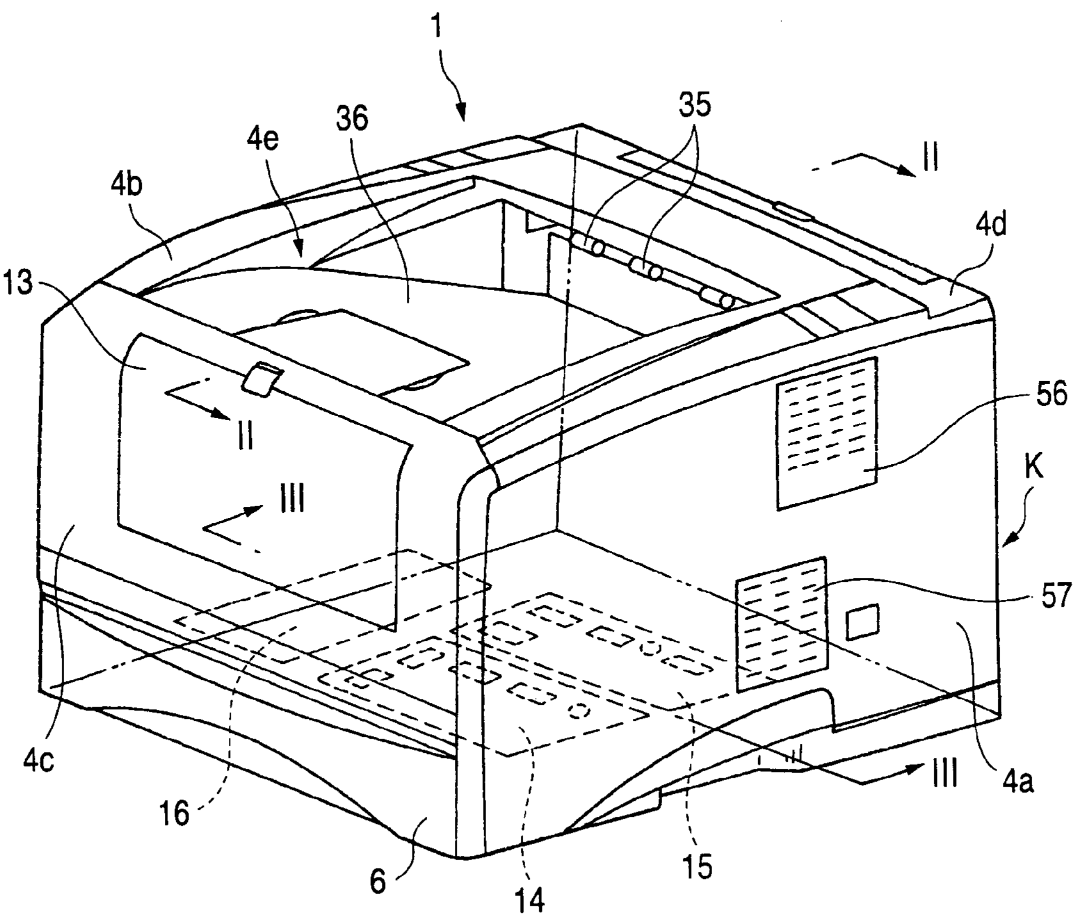
FIG. 1 is a schematic perspective view showing a laser printer according to an embodiment of an image forming apparatus of the invention.
Figure 2:
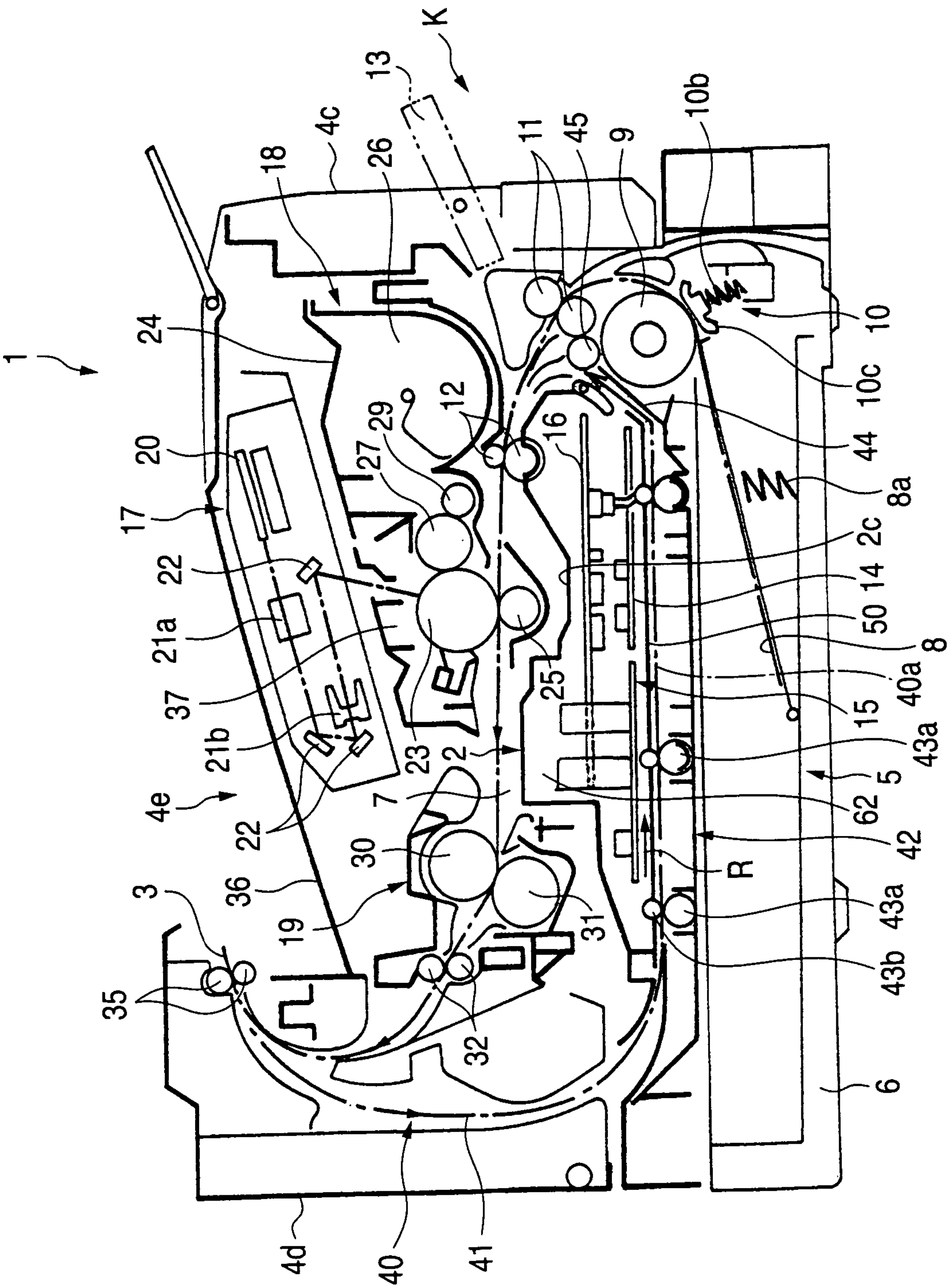
FIG. 2 is a sectional view taken along line II—II in FIG. 1.
Figure 3:
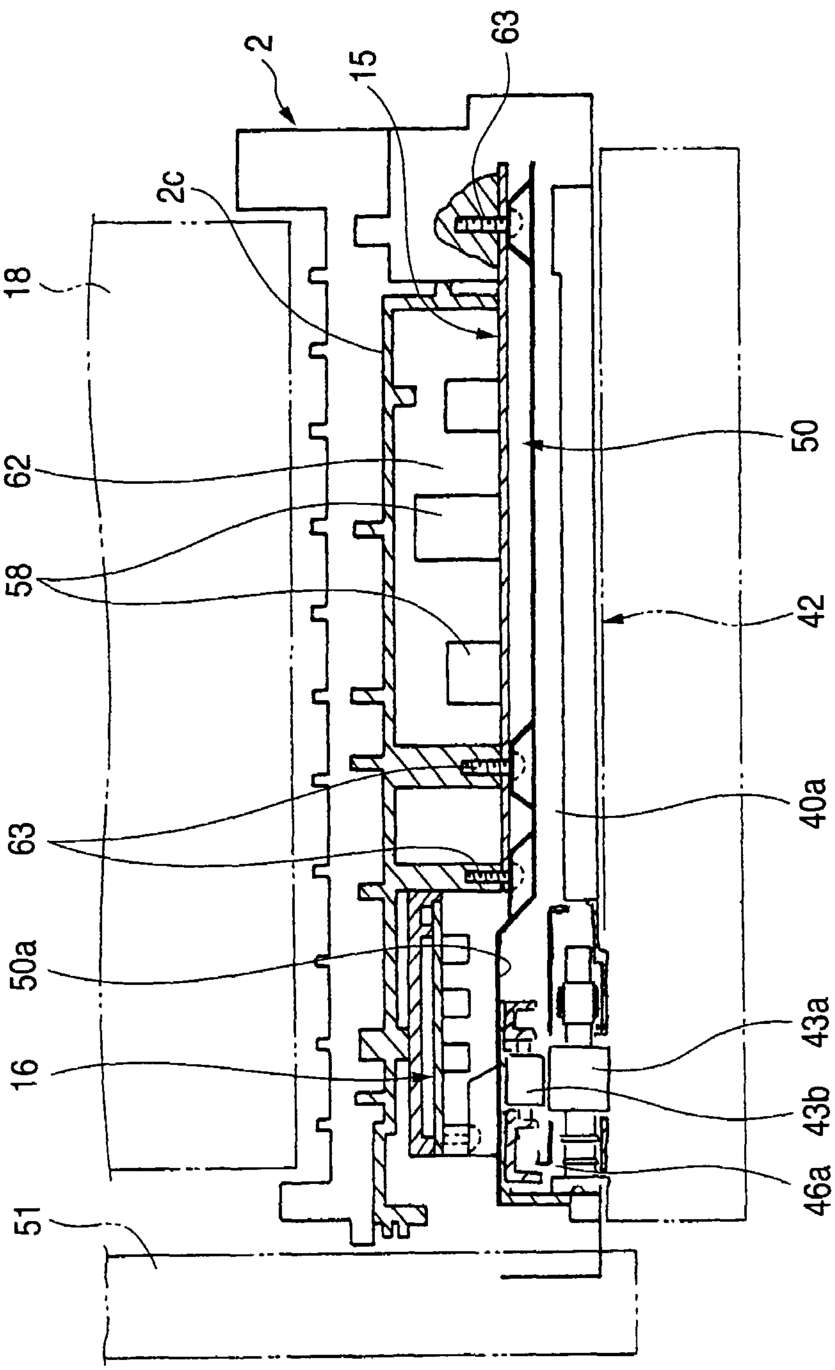
FIG. 3 is a sectional view taken along line III—III in FIG. 1.
Figure 4:
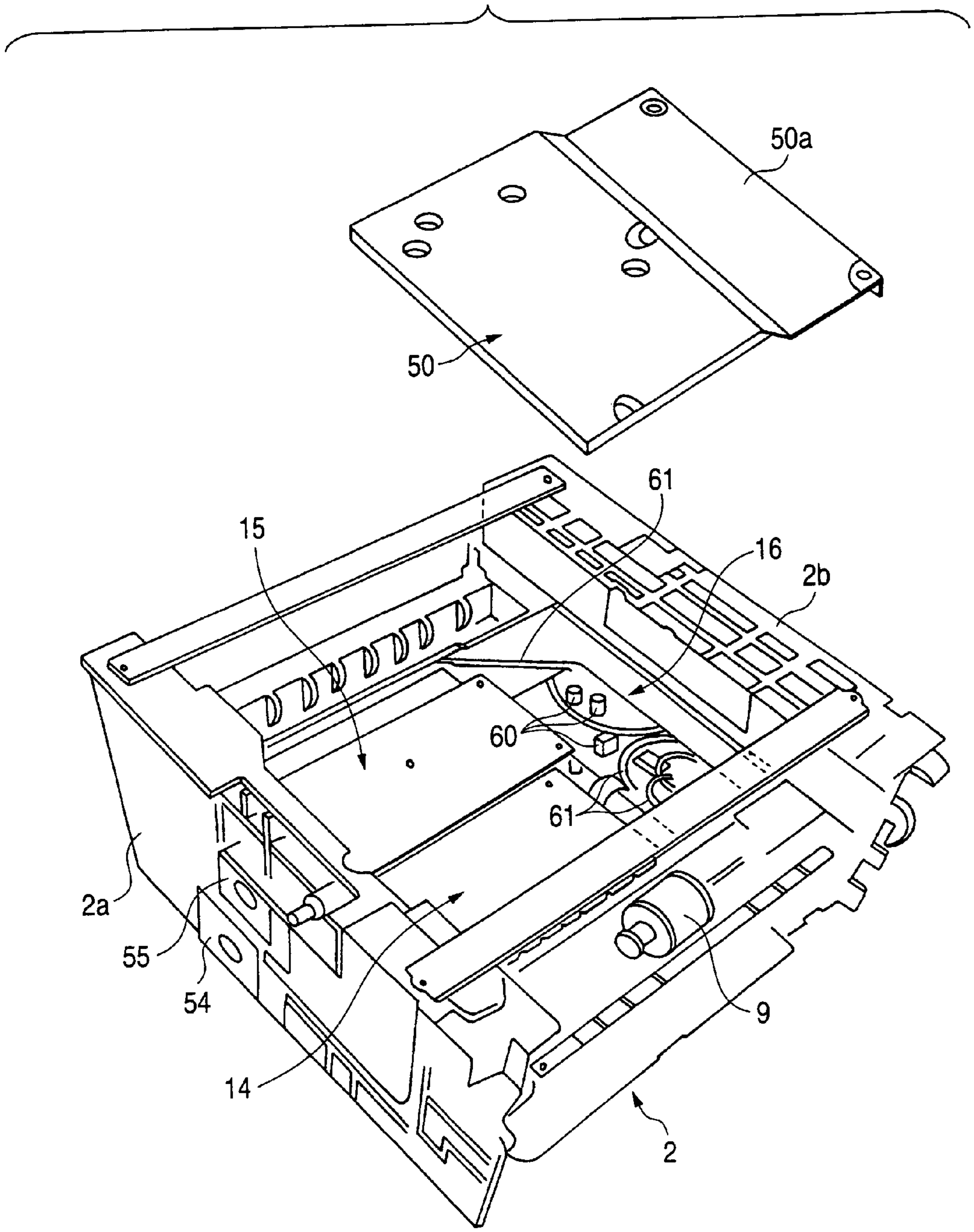
FIG. 4 is a perspective view showing a process of attaching circuit boards while a body case is turned upside down.
Figure 5:
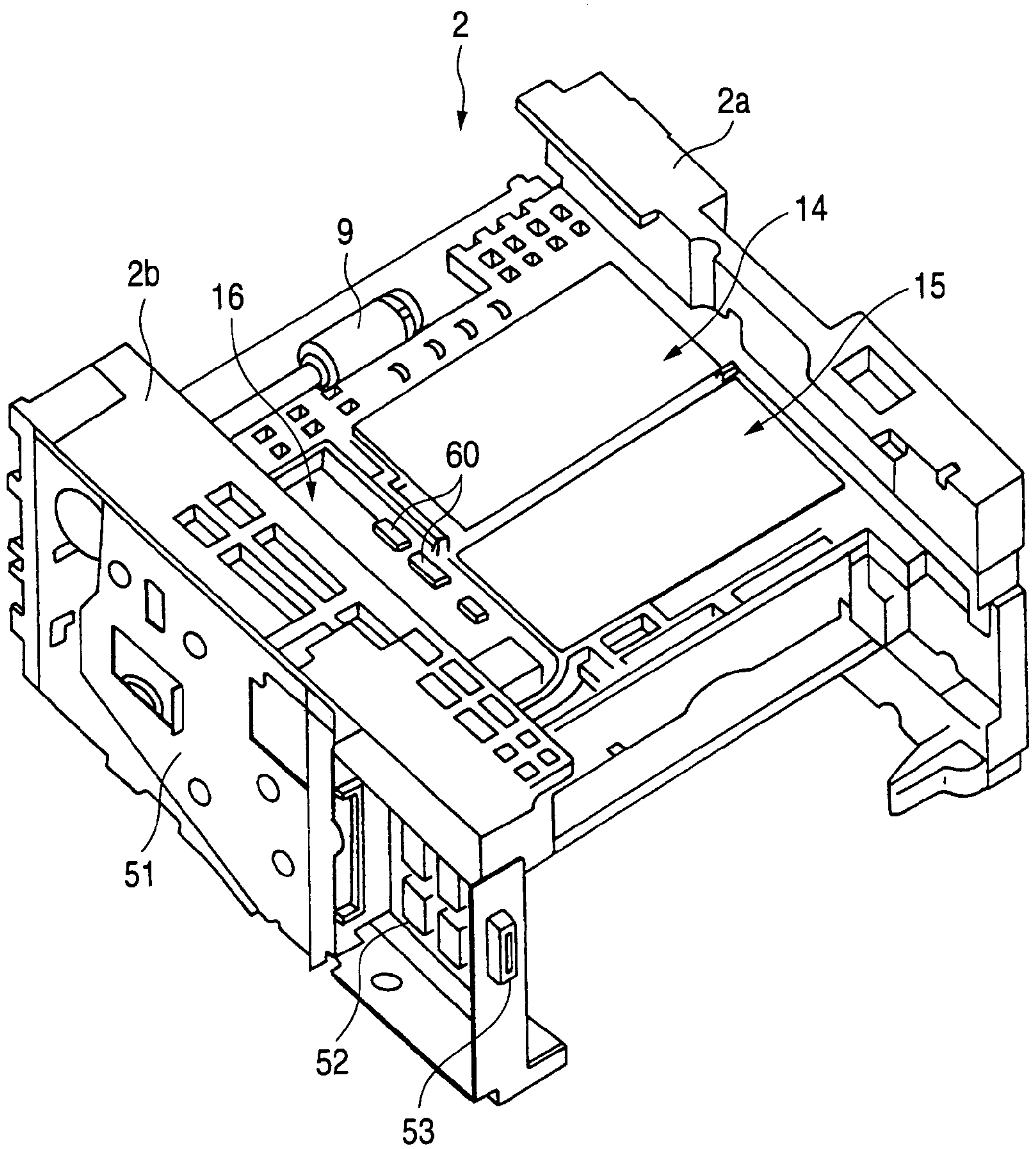
FIG. 5 is another perspective view showing a process of attaching the circuit boards while the body case is turned upside down.
Figure 6:
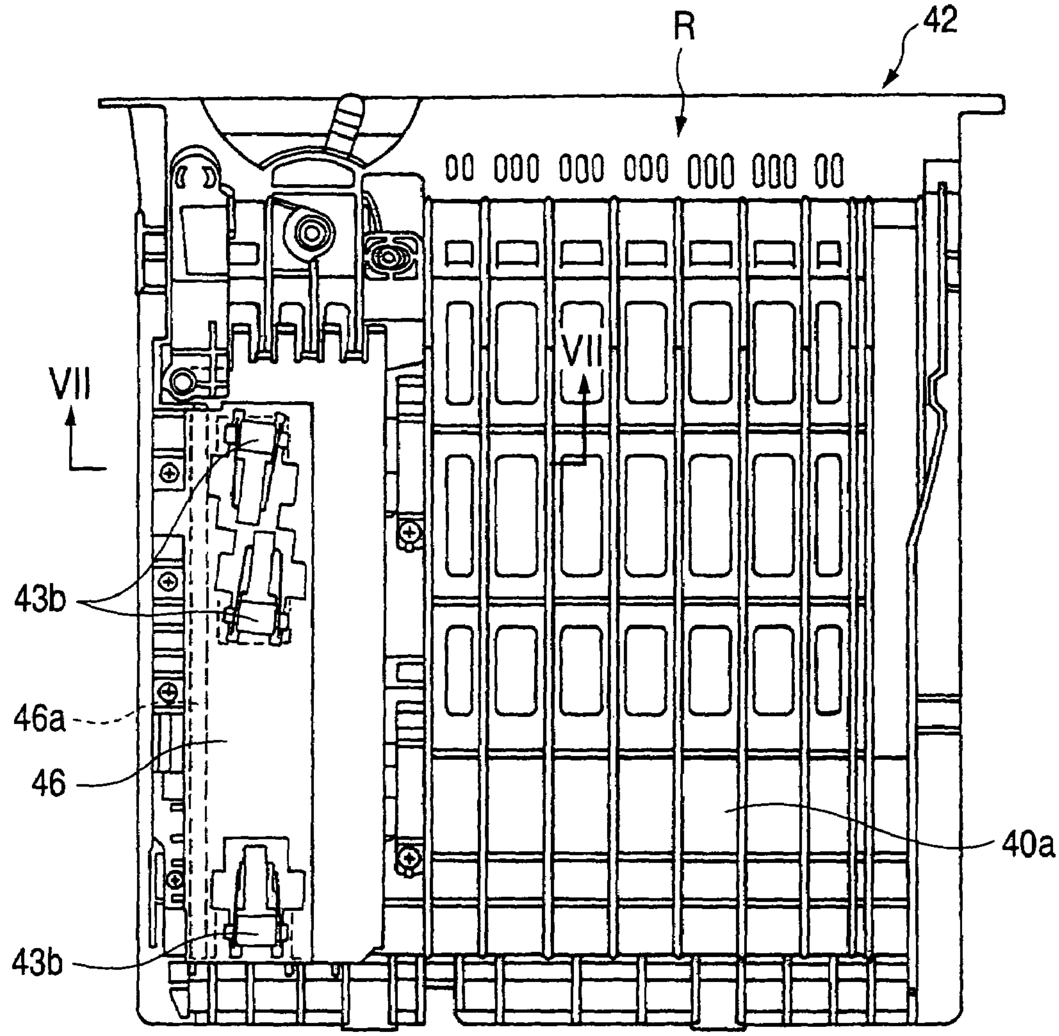
FIG. 6 is a plan view showing a return tray.
Figure 7:
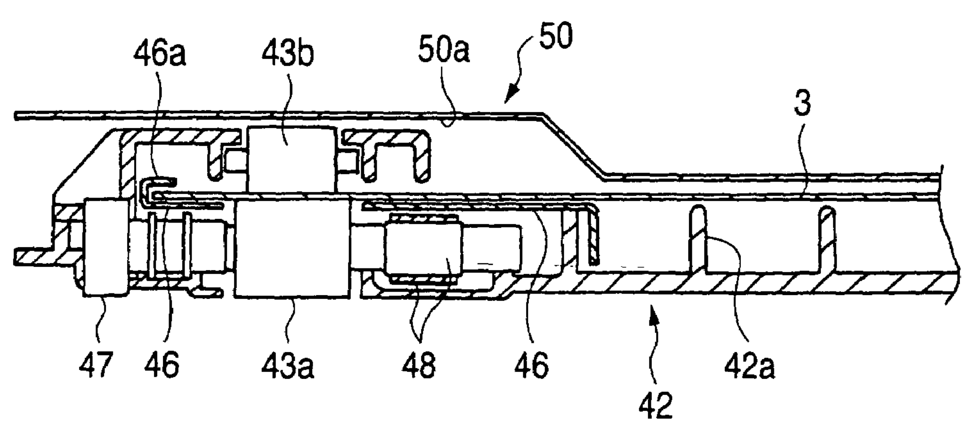
FIG. 7 is an enlarged sectional view taken along line VII—VII in FIG. 6.
Figure 8:
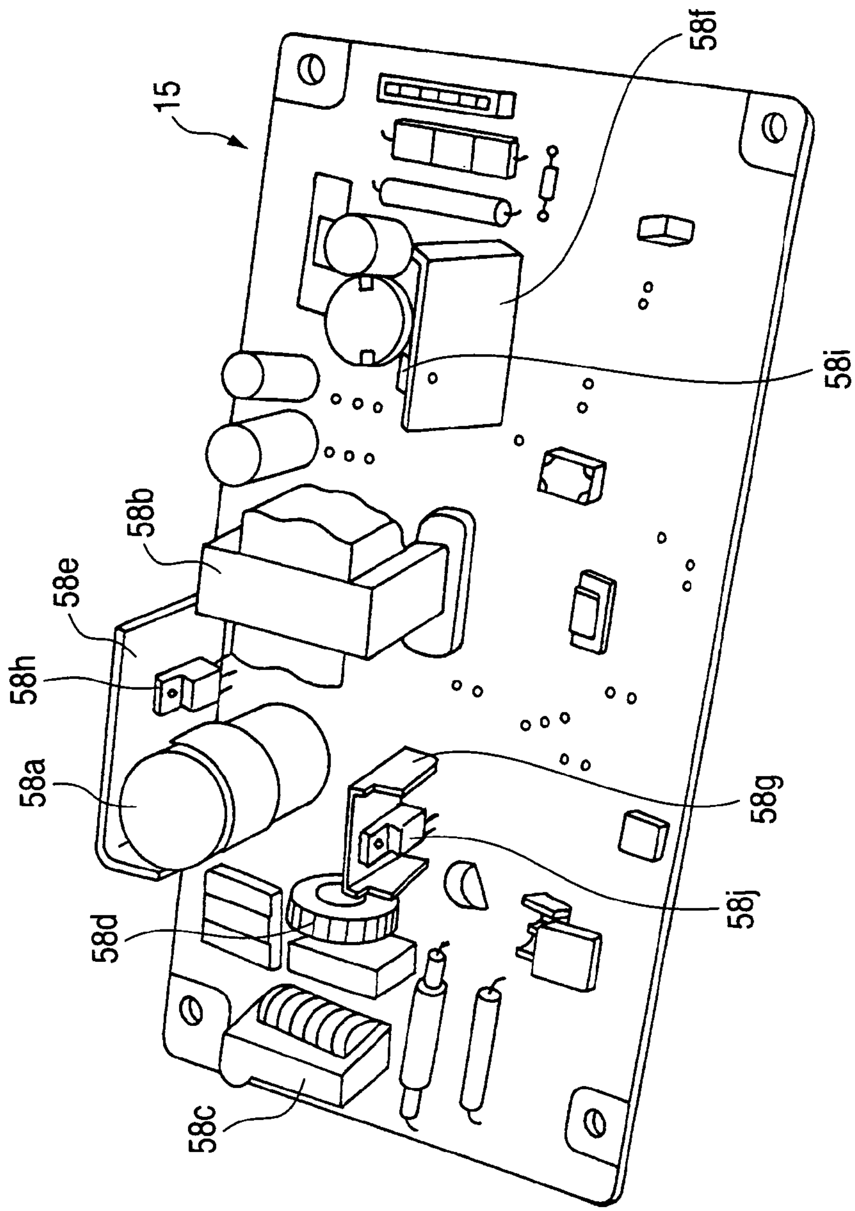
FIG. 8 is a perspective view showing an electronic component-mounting face of a low-voltage circuit board serving as a second circuit board.
Figure 9:
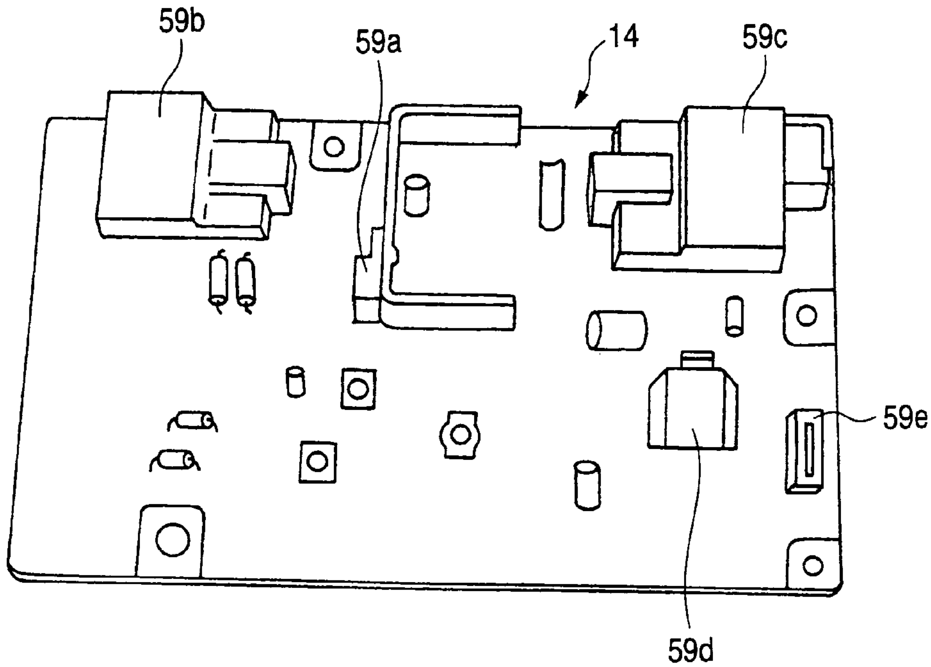
FIG. 9 is a perspective view showing an electronic component-mounting face of a high-voltage circuit board serving as a third circuit board.
Figure 10:
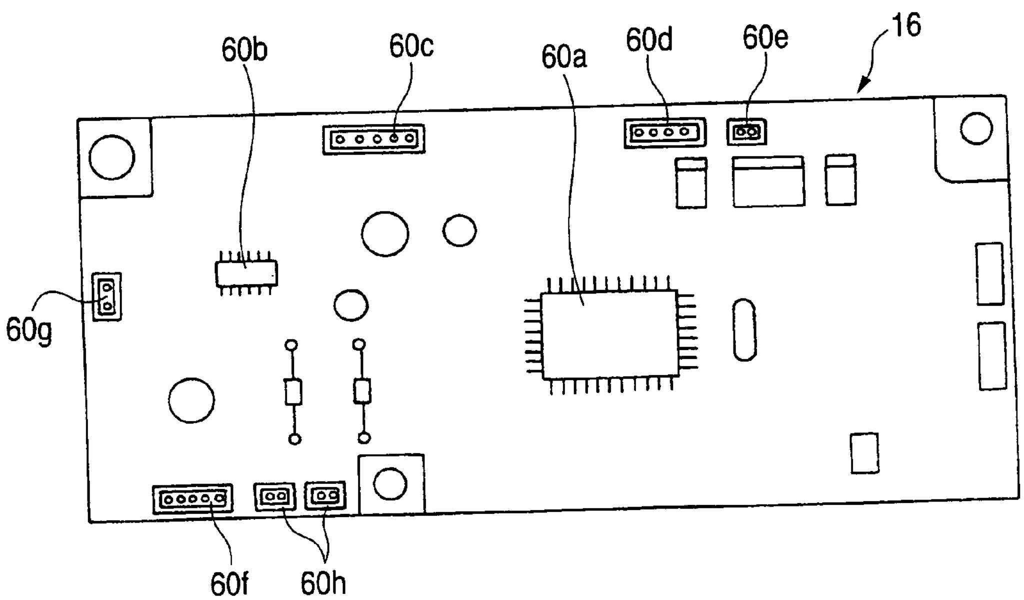
FIG. 10 is a plan view showing a print engine board serving as a first circuit board.

An embodiment of the invention will be described with reference to the accompanying drawings. FIG. 1 is a schematic perspective view showing a laser printer according to an embodiment of an image forming apparatus of the invention, FIG. 2 is a sectional view taken along line II—II in FIG. 1, FIG. 3 is a sectional view taken along line III—III in FIG. 1, FIG. 4 is a perspective view showing a state where the laser printer is turned upside down, FIG. 5 is a perspective view viewed from another direction showing a state where the laser printer is turned upside down, FIG. 6 is a plan view showing a return section, FIG. 7 is an enlarged sectional view taken along line VII—VII in FIG. 6, FIG. 8 is a perspective view showing an electronic component-mounting side of one of circuit boards, or a low-voltage circuit board, FIG. 9 is a perspective view showing an electronic component-mounting side of a high-voltage circuit board, and FIG. 10 is a plan view showing an electronic component-mounting side of a print engine board.

FIG. 1 is a perspective view of a laser printer 1. In the embodiment, a side into which a sheet feed tray 6 that will be described later is to be inserted is called a front side of the laser printer 1. When the laser printer 1 is viewed from the front side, side cover members 4*a*, 4*b* are detachably attached to right and left outer sides of a body frame 2 made of a synthetic resin by screws (not shown). A front cover member 4*c* and a rear cover member 4*d* are detachably attached by screws to front and rear outer sides of the body frame 2. Furthermore, an upper cover member 4*e* having a sheet discharging tray 36 and an operation section is detachably attached to an upper face of the body frame 2 by screws (not shown), thereby constituting a body case K. The side cover members 4*a*, 4*b*, the front and rear cover members 4*c*, 4*d*, and the upper cover member 4*e* are also made of a synthetic resin.

In the body frame 2, as shown in FIGS. 2, 3, 4, and 5, right and left side frame portions 2*a*, 2*b* to which the right and left side cover members 4*a*, 4*b* are to be attached are formed integrally with a partition wall 2*c* that vertically partitions the body frame 2 at a vertical intermediate position of inner side faces of the side frame portions 2*a*, 2*b*. A process unit 18 serving as an image forming unit which forms a predetermined image on a fed sheet 3, a scanner unit 17, a fixer 19 serving as a fixing unit and other members are disposed above the partition wall 2*c*. As will be described later, first boards 15, 16, and a second board 14 which serve as circuit boards are placed at a lower side of the partition wall 2*c*, and lower faces of the boards are covered by a cover plate 50 that is formed by a metal plate or the like.

A return path which will be described later, and a sheet feeder 5 for feeding sheets 3 (cut sheets) serving as recording medium are placed below the cover plate 50. The sheet feeder 5 includes a sheet feed tray 6 which is detachable attached to the body frame 2, a sheet pressing plate 8 which is disposed in the sheet feed tray 6, a D-shaped sheet feeding roller 9 which is disposed above one end portion of the sheet feed tray 6 to intermittently make one rotation, and a separating member 10.

As shown in FIGS. 2 and 3, a transport path 7 for the sheet 3 elongating from the sheet feeding roller 9 to an image forming position (a contact area between a photosensitive drum 23 and a transfer roller 25, i.e., a transfer position where a toner image on the photosensitive drum 23 is transferred to the sheet 3) is formed between the side frame portions 2*a*, 2*b* of the body frame 2, and between the upper face of the partition wall 2*c* and a lower face of a case of the process unit 18. In the transport path 7, a transport roller pair 11 and a registration roller pair 12 placed just before the image forming position are disposed at an adequate interval downstream from the sheet feeding roller 9 in a transportation direction.

The sheets 3 are stacked on the sheet pressing plate 8. The sheet pressing plate 8 is swingably supported at an end portion which is remote from the sheet feeding roller 9, thereby enabling the end portion close to the roller to be vertically movable. The sheet pressing plate is upward urged from a back side by a spring 8*a*. The sheet feeding roller 9 and the separating member 10 are placed so as to be opposed to each other. The separating member 10 includes a separating pad (not shown) that is formed by a member having a large coefficient of friction. The separating pad is pressed toward the sheet feeding roller 9 by a spring 10*b* disposed on a back side of a pad support member 10*c* of the separating member 10.

The separating pad and the sheet feeding roller 9 are formed to be shorter in width in a direction perpendicular to the transportation direction of the sheet 3, than the sheet 3, and placed so as to be in contact only with an approximately central area of the sheet 3 in the width direction during a feeding process.

Among the sheets 3 stacked on the sheet pressing plate 8, the uppermost sheet 3 is pressed against the sheet feeding roller 9. When the sheet feeding roller 9 rotates, the sheet is nipped between the sheet feeding roller 9 and the separating member 10 and fed one by one. The fed sheet 3 is sequentially transported by the transport roller pair 11 and the registration roller pair 12. After the sheet 3 is subjected to predetermined registration, the sheet is transported to the image forming position.

A manual feed tray 13 for manually feeding the sheets 3 is foldably mounted downstream from the transport roller pair 11 in the transportation direct (on the front cover member 4*c* of the body case K and at a level higher than the sheet feeder 5) (see FIGS. 1 and 2).

The scanner unit 17 is placed in an upper portion of the body case K and on a side of a lower face of the sheet discharging tray 36 in the upper cover member 4*e*. The scanner unit 17 includes a laser emitting section (not shown), a polygon mirror 20 which is rotatably driven, lenses 21*a* and 21*b*, and a reflecting mirror 22. A laser beam emitted from the laser emitting section on the basis of predetermined image data is passed through or reflected by the polygon mirror 20, the lens 21*a*, the reflecting mirror 22, and the lens 21*b* in the stated sequence, so that the surface of the photosensitive drum 23 that is an example of a photosensitive member (image carrier) of the process unit 18 is irradiated by rapid scanning.

The process unit 18 which constitutes a part of the image forming unit is equipped with a drum cartridge having the photosensitive drum 23 serving as a photosensitive member, a scorotron charger 37 serving as a charging section, and the transfer roller 25 serving as a transfer section; and a developing cartridge 24 that is detachably attached to the drum cartridge. The developing cartridge 24 includes a toner accommodation unit 26, a developing roller 27 serving as a developing section, a layer thickness regulating blade (not shown), and a toner supplying roller 29.

The toner accommodation unit 26 is filled with a positive charging nonmagnetic single-component polymer toner which is a developer. When the toner is supplied to the developing roller 27 by the toner supplying roller 29, the toner is positively friction-charged by the toner supplying roller 29 and the developing roller 27. In accordance with the rotation of the developing roller 27, the toner supplied onto the developing roller 27 is carried on the developing roller 27 in the form of a thin layer of a constant thickness as a result of sliding friction with the layer thickness regulating blade. The photosensitive drum 23 being rotatable is opposed to the developing roller 27. The drum has a dram body being grounded and a positive charging photosensitive layer formed on the surface thereof and made of an organic photosensitive material such as polycarbonate.

The scorotron charger 37 serving as a charging section is placed above the photosensitive drum 23 with being separated therefrom by a predetermined gap so as not to be in contact with the photosensitive drum 23. The scorotron charger 37 is a positive charging scorotron charger in which a charging wire of tungsten or the like generates a corona discharge, and configured so as to positively charge in a uniform manner the surface of the photosensitive drum 23.

In accordance with the rotation of the photosensitive drum 23, the surface of the photosensitive drum 23 is first positively charged in a uniform manner by the scorotron charger 37, and then exposed to the rapid scanning of the laser beam from the scanner unit 17, to thereby form an electrostatic latent image based on predetermined image data on the surface.

When the developing roller 27 is rotated and the positively-charged toner carried on the developing roller is opposed to be in contact with the photosensitive drum 23, the toner is supplied to the electrostatic latent image formed on the surface of the photosensitive drum 23, i.e., the exposed portion of the surface of the photosensitive drum 23 which is exposed to the laser beam to lower the potential. As a result, the toner is selectively carried to develop the image, so that a toner image is formed.

The transfer roller 25 is placed below the photosensitive drum 23 so as to be opposed to the photosensitive drum 23. The transfer roller 25 has a metal roller shaft covered by a roller made of an ion-conductive rubber material. During the transferring process, a transfer bias (a transfer forward bias) is applied to the roller by a transfer bias applying power supply. During a period of time when the sheet 3 passes between the photosensitive drum 23 and the transfer roller 25, therefore, the toner image carried on the surface of the photosensitive drum 23 is transferred to the sheet 3.

Subsequently, the configuration of the fixer 19 serving as a fixing unit will be described. As shown in FIG. 1, the fixer 19 is placed downstream from the process unit 18 in the transportation direction. The fixer 19 includes a heating roller 30, a pressure roller 31 which is placed so as to press the heating roller 30, and a pair of transportation rollers 32 which are disposed downstream from those rollers. The heating roller 30 is made of a metal such as aluminum and includes a heater such as a halogen lamp, so that the toner that is transferred onto the sheet 3 in the process unit 18 is heat-fixed when the sheet 3 passes between the heating roller 30 and the pressure roller 31. Thereafter, the sheet 3 is transported by the transportation rollers 32, and then discharged onto the sheet discharging tray 36 by sheet discharge rollers 35 in a sheet discharge path inside the rear cover member 4*d* of the body case K.

The embodiment further has a return section 40 for forming an image on both the front and rear faces of the sheet 3. The return section 40 includes an inverting mechanism which inverts the transportation direction of the sheet 3, an inversion path 41, and a return path 40*a* which is used for transporting the sheet 3 to another transporting member 45 that is placed in the vicinity of the sheet feeding roller 9 serving as the above-described transporting section. The sheet discharge rollers 35 are selectively rotated in the forward or reverse direction to perform a function of the inverting mechanism.

In the return section 40, an example of the return path 40*a* that substantially horizontally elongates between the cover plate 50 and the upper face of the sheet feed tray 6 is a return tray 42 that is detachably placed on the upper face of the sheet feed tray 6 as shown in FIGS. 1, 3, 6, and 7. A stationary guide face 42*a* which supports the unprinted face (lower face) of the sheet 3 is on one side of the return tray 42 in the width direction of the returned sheet 3. A reference guide plate 46 which elongates in the return direction of the sheet 3 (the direction of the arrow R in FIGS. 2 and 6) toward the other transporting member 45 is fixed to the other side of the return tray 42. A reference guide portion 46*a* which is bent so as to have a lateral U-like section shape is disposed in one side edge of the reference guide plate 46 so as to similarly elongate toward the other transporting member 45. Plural pairs of return rollers 43*a*, 43*b* are arranged at adequate intervals in the direction of the arrow R so as to vertically sandwich the reference guide plate 46. Lower return rollers 43*a* are driven via a driving gear 47 and a belt pulley 48. Upper return rollers 43*b* are pressed against the lower return rollers 43*a* via urging members such as torsion springs, respectively. The return rollers 43*b* placed upstream in the return direction of the sheet 3 are skewly arranged so as to move one side edge of the sheet 3 toward the reference guide portion 46*a* (see FIG. 6).

In printing on both sides of the sheet 3, the sheet 3 on one face of which an image is formed is transported by the transportation rollers 32, and then is once stopped in a state where the rear edge of the sheet 3 is nipped by the sheet discharge rollers 35. Thereafter, the sheet discharge rollers 35 reversely rotates to send the sheet 3 into the inversion path 41 inside the rear cover member 4*d*.

Subsequently, the sheet 3 is transported by the return roller pairs 43*a*, 43*b* on the return tray 42 placed on the lower face side of the cover plate 50, while the side edge of the sheet 3 butts against the reference guide portion 46*a* of the reference guide plate 46. Therefore, the inclination of the sheet 3 with respect to the return direction (the arrow R) is corrected, and the position of the side edge (the side edge which is perpendicular to the return direction) of the sheet 3 that butts against the reference guide portion 46*a* is restricted. The sheet is then returned via a return guide plate 44 to the other transporting member 45. In the position of the registration roller pair 12, as a result, the sheet 3 is inverted so that the unprinted face of the sheet 3 is upward directed. The sheet in this state passes over the image forming position, so that an image is formed on a back face of the sheet 3.

In this embodiment, the transporting section includes a transport path which elongates from the sheet feeding roller 9 to the sheet discharge rollers 35 via the image forming unit (the process unit 18) and the fixer 19, the inversion path 41 and the return path 40*a* on the return tray 42 which return the sheet 3 to the other transporting member 45 to conduct double-side printing, and the transport members 9, 11, 12, 23, 25, 30, 31, 32, 35, 43*a*, 43*b*, and 45.

In the body frame 2, a power transmission frame 51 which is configured by a metal plate is attached to a place outside the left side frame portion 2*b* and close to the placement position of the sheet feeding roller 9 (the front side of the laser printer 1). The frame includes a driving gear train for driving the sheet feeding roller 9, the process unit 18, the developing cartridge 24, the fixer 19, and the return rollers 43*a*. A main control board 52 including a CPU, a RAM, and a ROM is attached on the rear side of the power transmission frame. A connector 53 for cord connection with an external apparatus, and a connector (not shown) for a power supply cord are disposed in the rear end of the laser printer 1 (see FIG. 5).

A cooling fan 54 for discharging heat generated in the fixer 19 to the outside of the body case K is placed in the upper side of the right side frame portion 2*a* of the body frame 2. A cooling fan 55 for discharging heat generated in the high-voltage circuit board 14 serving as a third circuit board which will be described later, the low-voltage circuit board 15 serving as a second circuit board, and the print engine board 16 serving as a first circuit board is placed in the lower side of the right side frame portion. The heat is discharged to the outside of the apparatus through exhaust openings 56, 57 which are formed at positions in the right side cover member 4*a* corresponding to the cooling fans 54, 55 (see FIGS. 1 and 4).

Now, with reference to FIGS. 1 to 5 and 8 to 10, a description will be given in detail of the arrangement and configuration of the print engine board 16 serving as the first circuit board, the low-voltage circuit board 15 serving as the second circuit board, and the high-voltage circuit board 14 serving as the third circuit board. The low-voltage circuit board 15 lowers a commercial voltage (100 to 220 volts) supplied through the power supply cord (not shown) to a predetermined low voltage, and supplies the low voltage to the main control board 52, etc. The high-voltage circuit board 14 applies a high voltage to the charger 37, the transfer roller 25 etc., in the process unit 18. The print engine board 16 is connected to the main control board 52 to drive a driving motor and actuators (both not shown) such as electromagnetic solenoids of a one-rotation clutch in the sheet feeder 5 on the basis of instructions from the CPU of the main control board 52, and also supplies signals from various sensors to the main control board 52.

As shown in FIGS. 1 to 5, the low-voltage circuit board 15 and the high-voltage circuit board 14 are placed on the side of the lower face of the partition wall 2*c* of the body frame 2, and close to the right side frame portion 2*a* with the faces of the boards being at the same level. The boards are upward placed so that plural electronic components 58*a* to 58*d*, 58*h* to 58*j*, and the like mounted on the low-voltage circuit board 15 shown in FIG. 8, and electronic components (such as a transistor 59*a* attached to a heat sink, transformers 59*b* to 59*d*, and a connector 59*e*) mounted on the high-voltage circuit board shown in FIG. 9 are directed toward the partition wall 2*c* (the upper side of the body frame 2).

The print engine board 16 shown in FIG. 10 and serving as the first circuit board is placed so that low-height electronic components (such as a gate array 60*a*, a comparator 60*b*, and terminals 60*c* to 60*h* for harness connection) which are mounted on the board are downward directed in the body case K. In the assembling process, the boards 14, 15, and 16 are attached from the bottom side of the body frame 2 (the upper side in FIGS. 4 and 5) in a state where the body frame 2 is turned upside down as shown in FIGS. 4 and 5. The electronic components mounted on the low-voltage circuit board 15 serving as the second circuit board are, for example, an electrolytic capacitor 58*a*, a transformer 58*b*, a choke coil 58*c*, and a coil 58*d* which are bulky and tall, and an FET 58*h*, a constant voltage IC 58*i*, a triac 58*j*, and the like which are attached respectively to tall heat sinks 58*e* to 58*g*. These components are taller and larger than the electronic components 60*a* to 60*h* mounted on the print engine board 16. Therefore, the low-voltage circuit board is placed so that the electronic components 58*a* to 58*d* and 58*h* to 58*j* and the heat sinks 58*e* to 58*g* for radiating heat generated by the electronic components are accommodated in a tall space 62 (see FIGS. 2 and 3) that is formed by upward projecting the partition wall 2*c*. Harnesses to be connected to the low-voltage circuit board 15 and the high-voltage circuit board 14 are small in number and short. Even when the wiring state of a harness (not shown) cannot be seen during the work of attaching the harness in the electronic component-mounting sides of the circuit boards 14, 15, therefore, the harness can be easily prevented from being caught by another component or portion. By contrast, the print engine board 16 is placed so that the side on which the electronic components 60 are mounted is directed to the bottom of the body frame 2, enabling a worker to see the electronic components 60*a* to 60*h* and harnesses 61 connected to the components (see FIG. 4). In attaching the cover plate 50 in this state as described later, the cover plate 50 can be attached while checking the wiring state of the harnesses 61 and preventing the harnesses 61 from being caught between the cover plate 50 and the electronic components 60*a* to 60*h*.

According to the configuration, it is possible to attain further advantages that the connection state of the harnesses can be easily checked during inspection or repair, and that the harnesses can be easily connected and disconnected.

As seen from FIG. 2, in the space 62 between the process unit 18 serving as the image forming unit and the fixer 19 serving as the fixing unit, the partition wall 2*c* of the body frame 2 which is positioned below the unit and the fixer is formed so as to be upward projected, and the tall components 58*a* to 58*j* of the low-voltage circuit board 15 serving as the second circuit board are placed in the tall space 62 below the partition wall 2*c*, so as to be directed in the upward direction of the body case K. Therefore, a wasteful vertical space in the body case K can be reduced, and the height of the body frame 2 can be further shortened.

The circuit board 15 (14) at a position close to the one side, and the circuit board 16 at a position close to the other side are placed so as not to overlap with each other in a direction (the height direction of the body frame 2) which is perpendicular to the placement surfaces (horizontal surfaces) of the circuit boards 15, 16. Hence, the electronic components mounted on the boards are prevented from overlappingly interfering with each other, and the assembly work can be facilitated.

Since the circuit board 15 (14) at a position close to one side, and the circuit board 16 at a position close to the other side are placed in a stepwise manner, a step 50*a* can be formed in the cover plate 50 so as to elongate along the boards (see FIG. 4).

The large step 50*a* (corresponding to the place of the circuit board 16) of the cover plate 50 allows the vertical space with respect to the return tray 42 placed above the sheet feed tray 6 to be enlarged. When the return rollers 43*a*, 43*b* some of which are skewly arranged are placed in the step portion, therefore, the height of the body frame 2, and hence the overall height of the laser printer 1 can be reduced.

A space between the cover plate 50 and the partition wall 2*c* may communicate with a substantially horizontal air suction path for the cooling fan 55, so that the heat generated by the circuit boards 14, 15, and 16 can be smoothly discharged.

In a state where all the circuit boards 14, 15, and are placed, the circuit boards are covered by an electrically insulating film (not shown) from the bottom side of the body frame 2. The cover plate 50 is then placed and fastened by screws 63 to bosses which are downward projected (toward the bottom) from the lower face of the partition wall 2*c* of the body frame 2. Since the cover plate and the circuit boards 14, 15, and 16 are fastened together by the screws 63, the assembly work can be more simplified as compared with a case where the circuit boards are once fixed by separate screws and the cover plate is then screwingly fastened.

The low-voltage circuit board 15 serving as the second circuit board, and the high-voltage circuit board 14 serving as the third circuit board are placed at positions close to the one side of the body case K (close to the right side frame portion 2*a*), and the print engine board 16 serving as the first circuit board is placed at a position close to the other side of the body case K (close to the left side frame portion 2*b*). Moreover, the circuit boards are placed in a stepwise manner so that the levels of the circuit boards 14, 15 are identical with each other and positioned on the side of the bottom of the body case K, and the level of the print engine board 16 is higher than the levels of the circuit boards 14, 15 and positioned on the side of the bottom of the body case K.

The print engine board 16 on which the low-height electronic components 60*a* to 60*h* are mounted so as to be directed toward the bottom of the body case K is placed at a higher level, the low-voltage circuit board 15 on which the tall components 58*a* to 58*g* are mounted so as to be directed toward the upper side of the body case K is placed at a lower level, and the return rollers 43*a*, 43*b* and the reference guide plate 46 constituting a part of the transporting section are placed in the space that is defined by the height difference between the two kinds of electronic components (see FIG. 3). Therefore, a wasteful vertical space between the partition wall 2*c* and the cover plate 50 is eliminated, and the height of the body frame 2, and hence the overall height of the laser printer 1 can be reduced. Moreover, the cover plate 50 can be made close to the level of the circuit board 16.

The step in the cover plate 50 is formed at a position which is opposed to the second circuit board, and which is at a higher level, the transporting section is placed on the side of the higher step portion, and the cover plate on the side of the lower step portion functions as an upper guide plate of the return path for the recording medium. Therefore, it is not required to separately dispose a dedicated upper guide, and a return path for a recording medium in an image forming apparatus in which double-side printing is enabled can be formed without increasing the height of the body case, thereby attaining an advantage that an image forming apparatus of a reduced height can be provided. When the cover plate is made of a metal, the cover plate can function also as an electromagnetic shield.

The print engine board 16 on which the low-height electronic components 60*a* to 60*h* are mounted so as to be directed toward the bottom of the body case K is placed at a higher level, the return section constituting a part of the transporting section, i.e., the return rollers 43*a*, 43*b* and the reference guide plate 46 are placed at a position which is opposed from the lower side to the print engine board. On the other hand, the low-voltage circuit board 15 on which the tall electronic components 58*a* to 58*g* are mounted so as to be directed toward the upper side of the body case K is placed at a lower level, and only the return path 40*a* (the upper face of the return tray 42) is formed so as to be opposed to the lower face of the board, so that a sheet transportation space of a low height (a reduced height) is defined (see FIG. 3). Therefore, a wasteful vertical space can be eliminated, and the overall height of the body case K can be further reduced.

As shown in FIG. 7, one side edge of the returned sheet 3 butts against the reference guide portion 46*a* which is formed in one side edge (close to the left side frame portion 2*b*) of the reference guide plate 46, so that the inclination of the sheet 3 can be corrected, and the position of the one side edge of the sheet 3 can be restricted in a direction perpendicular to the transportation direction in the return of the sheet 3. Therefore, it is possible that the printing position and the direction of an image in double-side printing can be made proper.

When an attaching structure of circuit boards in the invention is applied to a multifunctional image forming apparatus having mechanisms of a laser printer or an ink jet printer, and a facsimile apparatus, the image forming apparatus can be reduced in height or configured as a compact apparatus.

As was described above, according to a first aspect of the image forming apparatus, a first circuit board which is disposed in the body case, and on which electronic components are mounted, and a second circuit board which is disposed in the body case in substantially parallel to the first circuit board, and on which electronic components that are larger in size than those mounted on the first circuit board are mounted are placed, and the transporting section can be disposed with unwastefully using the step-like space which is formed by the height difference between the electronic components mounted on the boards. Consequently, the image forming apparatus can attain the effect that the vertical dimension of the body case of the apparatus can be reduced as far as possible to miniaturize the apparatus.

According to a second aspect of the image forming apparatus, the tall transporting section is placed with being opposed and parallel to the first circuit board having low-height electronic components. When the boards are placed, therefore, the transporting section can be disposed with unwastefully using the step-like space which is formed by the height difference between the electronic components mounted on the boards. Consequently, the image forming apparatus can attain the effect that the vertical dimension of the body case of the apparatus can be reduced as far as possible to miniaturize the apparatus.

According to a third aspect of the image forming apparatus, the tall electronic components mounted on the second circuit board can be placed with using the space formed between the image forming unit and the fixing unit. Consequently, the image forming apparatus can attain the effect that the vertical dimension of the body case can be reduced as far as possible to miniaturize the apparatus.

According to a fourth aspect of the image forming apparatus, the electronic components mounted on the circuit boards do not overlap with each other in a direction (the height direction of the body case) which is perpendicular to the placement surfaces (horizontal surfaces) of the circuit boards, in the state where the circuit boards are placed in the body case. Consequently, the electronic components mounted on the boards are prevented from overlappingly interfere with each other, and the assembly work can be facilitated.

According to a fifth aspect of the image forming apparatus, the first circuit board and the second circuit board are placed substantially horizontally below the image forming unit. Consequently, the image forming apparatus can attain the effect that the work of attaching the boards can be easily performed in the state where the body case is turned upside down.

According to a sixth aspect of the image forming apparatus, the electronic component-mounting surface of the first circuit board, and that of the second circuit board are placed in opposite directions. When the work of attaching the boards is performed in the state where the body case is turned upside down, therefore, at least one of the circuit boards can be set to a state where the electronic component-mounting surface can be seen. Consequently, it is possible to eliminate disadvantages such as that the components collide against each other.

According to a seventh aspect of the image forming apparatus, the first circuit board is a control board which constitutes a control circuit of the image forming apparatus, and the second circuit board is a power supply circuit board which constitutes a power supply circuit of the image forming apparatus. Tall electronic components are often mounted on a power supply circuit board. When such components are placed in a wasteful vertical space in the body case, therefore, an effect that the height of the body case can be reduced as far as possible to be miniaturized is attained.

According to an eighth aspect of the image forming apparatus, the apparatus further includes a transport path which is disposed in the body case, which has a portion elongating in substantially parallel to the first and second circuit boards, and along which the recording medium is transported. Therefore, the thin transport path can be placed in parallel to the flat circuit boards, so that the height of the body case can be reduced. Moreover, the transporting section is placed in the portion of the transport path, the portion elongating in substantially parallel to the first and second circuit boards. Therefore, placement is enabled with using the space which is formed by the height difference between the first and second circuit boards.

According to a ninth aspect of the image forming apparatus, the portion of the transport path elongating in substantially parallel to the first and second circuit boards is a return path along which, when an image formation is to be conducted on both faces of the recording medium, the recording medium on one face of which an image is formed by the image forming unit is again transported to the image forming unit. Consequently, the image forming apparatus can attain the effect that a return path of a reduced height can be easily formed parallel to both the circuit boards.

According to a tenth aspect of the image forming apparatus, the return path is placed at a level which is lower than levels of the first and second circuit boards, a reference guide which elongates in a transportation direction of the recording medium is disposed on one side of the return path, the reference guide being to butt against a side edge of the recording medium to restrict a position of the recording medium in a direction perpendicular to the transportation direction of the recording medium, and an inclination of the recording medium, and the transporting section transports the recording medium while causing the side edge of the recording medium to butt against the reference guide. Consequently, the image forming apparatus can attain the effect that double-side printing can be performed at a correct position while ensuring the inclination in the return of a recording medium on one face of which an image is already is formed, and the reference position in a direction perpendicular to the transportation direction of the recording medium.

According to an eleventh aspect of the image forming apparatus, a metal cover plate which covers the first and second circuit boards is disposed below the first and second circuit boards. Therefore, the return path for the recording medium can be separated from the circuit boards by the cover plate.

According to a twelfth aspect of the image forming apparatus, in the cover plate, a step is formed between a portion opposed to the first circuit board, and a portion opposed to the second circuit board. Consequently, the image forming apparatus can attain the effect that one face of the transport path can be easily formed simply by placing the cover plate along the step between the first and second circuit boards.

According to a thirteenth aspect of the image forming apparatus, the portion of the cover plate opposed to the first circuit board is opposed to the transporting section, and the portion of the cover plate opposed to the second circuit board functions as a guide for the recording medium which is transported by the transporting section.

The step is formed at a position which is opposed to the second circuit board, and which is at a higher level, the transporting section is placed on the side of the higher step portion, and the cover plate on the side of the lower step portion functions as an upper guide plate of the return path for the recording medium. Therefore, it is not required to separately dispose a dedicated upper guide, and a return path for a recording medium in an image forming apparatus in which double-side printing is enabled can be formed without increasing the height of the body case, thereby attaining an effect that an image forming apparatus of a reduced height can be provided. When the cover plate is made of a metal, the cover plate can function also as an electromagnetic shield.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An image forming apparatus comprising:

a body case;

an image forming unit disposed in the body case for forming an image on a recording medium;

a transporting section disposed in the body case for transporting the recording medium;

a first circuit board which is disposed in the body case and on which electronic components are mounted; and a second circuit board which is disposed in the body case in substantially parallel to the first circuit board and on which electronic components that are horizontally deviated from and larger in size than the electronic components mounted on the first circuit board are mounted, wherein at least a part of the transporting section is placed in a space which is defined by a height difference between the electronic components mounted on the first circuit board and the electronic components mounted on the second circuit board.

2. The image forming apparatus according to claim 1, wherein the first circuit board and the second circuit board are placed not to overlap with each other in a direction which is perpendicular to placement surfaces of the circuit boards.

3. The image forming apparatus according to claim 1, wherein the first circuit board and the second circuit board are placed substantially horizontally below the image forming unit.

4. The image forming apparatus according to claim 3, further comprising a transport path that has a portion elongating in substantially parallel to the first circuit board and the second circuit board.

5. The image forming apparatus according to claim 1, wherein an electronic component-mounting surface of the first circuit board and an electronic component-mounting surface of the second circuit board are placed in opposite directions.

6. The image forming apparatus according to claim 1, wherein the first circuit board comprises a control board which constitutes a control circuit of the image forming apparatus, and the second circuit board comprises a power supply circuit board which constitutes a power supply circuit of the image forming apparatus.

7. The image forming apparatus according to claim 1, further comprising a transport path which is disposed in the body case, which has a portion elongating in substantially parallel to the first and second circuit boards, and along which the recording medium is transported, wherein the transporting section is placed in the portion of the transport path, the portion elongating in substantially parallel to the first and second circuit boards.

8. The image forming apparatus according to claim 7, wherein the portion of the transport path elongating in substantially parallel to the first and second circuit boards is a return path along which, when an image formation is to be conducted on both faces of the recording medium, the recording medium on one face of which an image is formed by the image forming unit is again transported to the image forming unit.

9. The image forming apparatus according to claim 8, wherein the return path is placed at a level which is lower than levels of the first and second circuit boards, a reference guide which elongates in a transportation direction of the recording medium is disposed on one side of the return path, the reference guide being buttable against a side edge of the recording medium to restrict a position of the recording medium in a direction perpendicular to the transportation direction and an inclination of the recording medium, and the transporting section transports the recording medium while causing the side edge of the recording medium to butt against the reference guide.

10. The image forming apparatus according to claim 8, wherein a metal cover plate which covers the first and second circuit boards is disposed below the first and second circuit boards, and at least a portion of the metal cover constitutes the return path.

11. The image forming apparatus according to claim 10, wherein a step is formed in the cover plate between a portion opposed to the first circuit board and a portion opposed to the second circuit board.

12. The image forming apparatus according to claim 11, wherein the portion of the cover plate opposed to the first circuit board is opposed to the transporting section, and the portion of the cover plate opposed to the second circuit board functions as a guide for the recording medium which is transported by the transporting section.

13. An image forming apparatus comprising:

a body case;

an image forming unit disposed in the body case for forming an image on a recording medium;

a transporting section disposed in the body case for transporting the recording medium;

a first circuit board which is disposed in the body case and on which electronic components are mounted; and a second circuit board which is disposed in the body case in substantially parallel to the first circuit board and on which electronic components that are larger in size than the electronic components mounted on the first circuit board are mounted, wherein the transporting section is placed in a position which is opposed to the first circuit board, and which is not opposed to the second circuit board.

14. The image forming apparatus according to claim 13, wherein the first circuit board and the second circuit board are placed not to overlap with each other in a direction which is perpendicular to placement surfaces of the circuit boards.

15. The image forming apparatus according to claim 13, wherein the first circuit board and the second circuit board are placed substantially horizontally below the image forming unit.

16. The image forming apparatus according to claim 15, further comprising a transport path that has a portion elongating in substantially parallel to the first circuit board and the second circuit board.

17. The image forming apparatus according to claim 13, wherein an electronic component-mounting surface of the first circuit board and an electronic component-mounting surface of the second circuit board are placed in opposite directions.

18. The image forming apparatus according to claim 13, wherein the first circuit board comprises a control board which constitutes a control circuit of the image forming apparatus, and the second circuit board comprises a power supply circuit board which constitutes a power supply circuit of the image forming apparatus.

19. The image forming apparatus according to claim 13, further comprising a transport path which is disposed in the body case, which has a portion elongating in substantially parallel to the first and second circuit boards, and along which the recording medium is transported, wherein the transporting section is placed in the portion of the transport path, the portion elongating in substantially parallel to the first and second circuit boards.

20. The image forming apparatus according to claim 19, wherein the portion of the transport path elongating in substantially parallel to the first and second circuit boards is a return path along which, when an image formation is to be conducted on both faces of the recording medium, the recording medium on one face of which an image is formed by the image forming unit is again transported to the image forming unit.

21. The image forming apparatus according to claim 20, wherein the return path is placed at a level which is lower than levels of the first and second circuit boards, a reference guide which elongates in a transportation direction of the recording medium is disposed on one side of the return path, the reference guide being buttable against a side edge of the recording medium to restrict a position of the recording medium in a direction perpendicular to the transportation direction and an inclination of the recording medium, and the transporting section transports the recording medium while causing the side edge of the recording medium to butt against the reference guide.

22. The image forming apparatus according to claim 20, wherein a metal cover plate which covers the first and second circuit boards is disposed below the first and second circuit boards, and at least a portion of the metal cover constitutes the return path.

23. The image forming apparatus according to claim 22, wherein a step is formed in the cover plate between a portion opposed to the first circuit board and a portion opposed to the second circuit board.

24. The image forming apparatus according to claim 23, wherein the portion of the cover plate opposed to the first circuit board is opposed to the transporting section, and the portion of the cover plate opposed to the second circuit board functions as a guide for the recording medium which is transported by the transporting section.

25. An image forming apparatus comprising:

a body case;

an image forming unit disposed in the body case for forming an image on a recording medium through an electrophotographic process;

a fixing unit disposed in the body case for fixing the image that is formed on the recording medium by the image forming unit;

a transporting section disposed in the body case for transporting the recording medium;

a first circuit board which is disposed in the body case and on which electronic components are mounted; and a second circuit board which is disposed in the body case and on which electronic components that are larger in size than the electronic components mounted on the first circuit board are mounted, wherein the electronic components mounted on the second circuit board are placed in a space which is defined between the image forming unit and the fixing unit.

26. The image forming apparatus according to claim 25, wherein the first circuit board and the second circuit board are placed not to overlap with each other in a direction which is perpendicular to placement surfaces of the circuit boards.

27. The image forming apparatus according to claim 25, wherein the first circuit board and the second circuit board are placed substantially horizontally below the image forming unit.

28. The image forming apparatus according to claim 27, further comprising a transport path that has a portion elongating in substantially parallel to the first circuit board and the second circuit board.

29. The image forming apparatus according to claim 25, wherein an electronic component-mounting surface of the first circuit board and an electronic component-mounting surface of the second circuit board are placed in opposite directions.

30. The image forming apparatus according to claim 25, wherein the first circuit board comprises a control board which constitutes a control circuit of the image forming apparatus, and the second circuit board comprises a power supply circuit board which constitutes a power supply circuit of the image forming apparatus.

31. The image forming apparatus according to claim 25, further comprising a transport path which is disposed in the body case, which has a portion elongating in substantially parallel to the first and second circuit boards, and along which the recording medium is transported, wherein the transporting section is placed in the portion of the transport path, the portion elongating in substantially parallel to the first and second circuit boards.

32. The image forming apparatus according to claim 31, wherein the portion of the transport path elongating in substantially parallel to the first and second circuit boards is a return path along which, when an image formation is to be conducted on both faces of the recording medium, the recording medium on one face of which an image is formed by the image forming unit is again transported to the image forming unit.

33. The image forming apparatus according to claim 32, wherein the return path is placed at a level which is lower than levels of the first and second circuit boards, a reference guide which elongates in a transportation direction of the recording medium is disposed on one side of the return path, the reference guide being buttable against a side edge of the recording medium to restrict a position of the recording medium in a direction perpendicular to the transportation direction and an inclination of the recording medium, and the transporting section transports the recording medium while causing the side edge of the recording medium to butt against the reference guide.

34. The image forming apparatus according to claim 32, wherein a metal cover plate which covers the first and second circuit boards is disposed below the first and second circuit boards, and at least a portion of the metal over constitutes the return path.

35. The image forming apparatus according to claim 34, wherein a step is formed in the cover plate between a portion opposed to the first circuit board and a portion opposed to the second circuit board.

36. The image forming apparatus according to claim 35, wherein the portion of the cover plate opposed to the first circuit board is opposed to the transporting section, and the portion of the cover plate opposed to the second circuit board functions as a guide for the recording medium which is transported by the transporting section.

* * * * *